United States Patent
Nguyen et al.

(10) Patent No.: US 6,529,409 B1
(45) Date of Patent: Mar. 4, 2003

(54) INTEGRATED CIRCUIT FOR CONCURRENT FLASH MEMORY WITH UNEVEN ARRAY ARCHITECTURE

(75) Inventors: Tam Nguyen, San Jose, CA (US); Michael Briner, San Jose, CA (US)

(73) Assignee: Silicon Storage Technology, Inc., Sunnyvale, CA (US)

(*) Notice: Subject to any disclaimer, the term of this patent is extended or adjusted under 35 U.S.C. 154(b) by 0 days.

(21) Appl. No.: 09/954,387

(22) Filed: Sep. 10, 2001

(51) Int. Cl.[7] .............................................. G11C 11/34
(52) U.S. Cl. ............................. 365/185.11; 365/230.03
(58) Field of Search .......................... 365/233, 230.03, 365/185.11

(56) References Cited

U.S. PATENT DOCUMENTS 6,073,207 A * 6/2000 Ideta .......................... 711/103
6,246,626 B1 * 6/2001 Roohparvar ................. 365/226

OTHER PUBLICATIONS

L.G. Fasoli et al., *A 64Mb User–Configurable Dual Bank Burst Mode FLASH Memory*, Aug. 12–16, 2001, p. 33–34.

* cited by examiner

*Primary Examiner*—M. Tran
(74) *Attorney, Agent, or Firm*—Gray, Cary, Ware & Freidenrich

(57) ABSTRACT

An integrated circuit 110 for concurrent flash memory. The circuit 110 has an uneven array architecture including a pair of arrays 112, 114 of a first size, and a pair of arrays 116, 118 of a second size. The arrays 112, 114, 116 and 118 are cooperatively linked in a manner which allows certain arrays to be read while other arrays are concurrently programmed or erased. The uneven array architecture of circuit 110 provides increased flexibility of bank size combinations for concurrent read and program/erase operation.

20 Claims, 3 Drawing Sheets

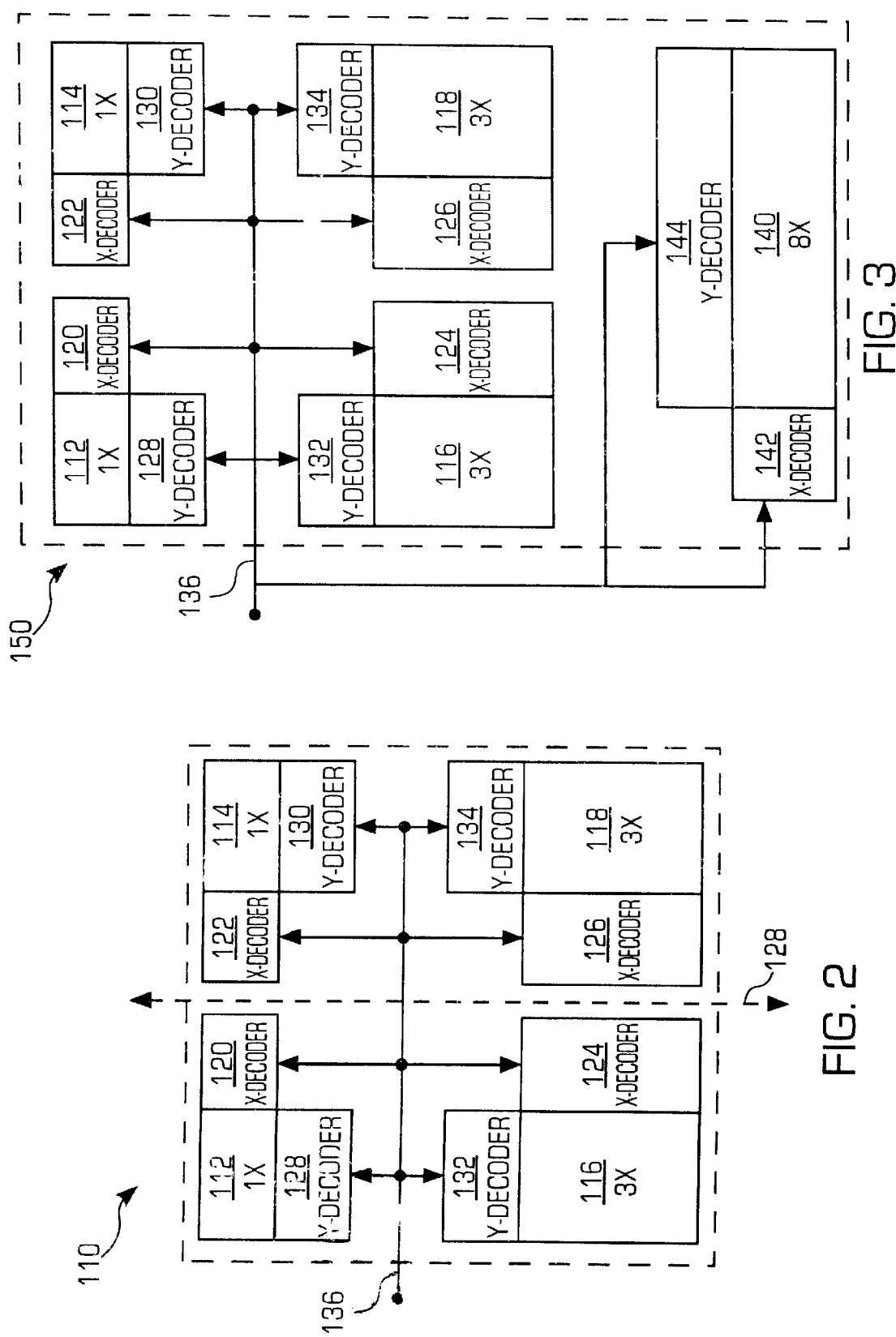

INTEGRATED CIRCUIT FOR CONCURRENT FLASH MEMORY WITH UNEVEN ARRAY ARCHITECTURE

FIELD OF THE INVENTION

The present invention generally relates to an integrated circuit for concurrent flash memory and more particularly, to an integrated circuit for concurrent flash memory having an uneven array architecture which provides improved flexibility relative to prior circuits.

BACKGROUND OF THE INVENTION

Semiconductor memory devices, such as flash memory devices, typically employ integrated circuits having arrays of memory cells to store and access electronic data. One type of integrated circuit, commonly referred to as a concurrent flash memory circuit, utilizes multiple arrays of memory cells to allow reading and programming/erasing functions to be performed simultaneously. Particularly, in this type of circuit, a first bank of memory cells comprising one or more arrays can be read while a second bank of memory cells comprising different arrays is concomitantly programmed or erased.

One example of a prior concurrent flash memory circuit is illustrated in FIG. 1. Circuit 10 includes four memory cell arrays 12, 14, 16, and 18 of equal size (e.g., 1X). Each array 12–18 includes a plurality of non-volatile memory cells (not shown) which are connected together in a two-dimensional configuration of rows and columns. Circuit 10 further includes four X-decoder blocks 20, 22, 24, and 26 which are respectively and communicatively coupled to arrays 12, 14, 16 and 18, and four Y-decoder blocks 28, 30, 32, and 34 which are respectively and communicatively coupled to arrays 12, 14, 16 and 18. Each X-decoder block 20–26 is coupled to address buses 36, 38 through logic circuitry 44, 46, respectively, and includes a plurality of conventional X-decoders which are effective to select certain rows of the memory arrays 12–18, based upon signals received from address buses 36, 38. Each Y-decoder block 28–34 is coupled to address buses 36, 38 through logic circuitry 44, 46, respectively, and includes a plurality of conventional Y-decoders which are effective to select certain columns of the memory arrays 12–18, based upon signals received from address buses 36, 38.

Circuit 10 further includes four sense amplifier blocks 48, 50, 52 and 54 which are communicatively coupled to arrays 12, 14, 16 and 18, respectively. Sense amplifier blocks 48, 50, 52 and 54 are coupled to data buses 40, 42 through logic circuitry 56, 58, respectively, and include a plurality of sense amplifiers that facilitate the reading and programming/erasing of data from and into arrays 12–18. Circuit 10 further includes a register 60 which determines which arrays 12–18 will be cooperatively linked to form each memory bank (i.e., to form memory banks 1 and 2). In alternate embodiments, concurrent memory operation may be facilitated by use of a metal option layer.

Address bus 36 and data bus 40 may be used to access a first bank of arrays (i.e., bank 1), which may include one or more cooperatively linked arrays 12–18, and address bus 38 and data bus 42 may be used to access a second bank of arrays (i.e., bank 2), which includes the remaining arrays. In this manner, circuit 10 allows a first memory operation, such as reading, to be performed on the first bank of arrays (i.e., bank 1), while a second memory operation, such as programming or erasing, is simultaneously performed on the second bank of arrays (i.e., bank 2).

While prior concurrent flash memory circuits, such as circuit 10, are effective to simultaneously perform reading and programming/erasing functions, they have limited flexibility. Particularly, the number of available bank size combinations (i.e., the available size combinations for the first bank and the second bank) is dependent upon the size of the various arrays which selectively form the memory banks.

Because the sizes of the arrays are identical in a conventional concurrent flash memory circuit, the number of possible bank size combinations for concurrent read and program/erase operation is limited. By way of example and without limitation, a conventional concurrent flash memory device including four arrays each having a size of 1X can provide only three unique bank size combinations for concurrent read and program/erase operation. That is, the possible size combinations for the first bank (e.g., the read bank) and the second bank (e.g., the program/erase bank) are limited to 1X/3X (e.g., one array for reading and three arrays for programming/erasing), 2X/2X (e.g., two arrays for reading and two arrays for programming/erasing), and 3X/1X (e.g., three arrays for reading and one array for programming/erasing).

Some prior flash circuits have attempted to implement three arrays in an uneven architecture. Such an architecture is discussed in L. G. Fasoli et al., A 64Mb User-Configurable Dual Bank Burst Mode FLASH memory, Digest of the Non-Volatile Semiconductor Memory Workshop Aug. 12th–16th, 2001, at p. 33. The above-referenced architecture implements three arrays in a 1X, 1X, 2X uneven configuration. While this architecture is user-configurable, it provides no additional bank size combinations than prior 1X, 1X, 1X, 1X configurations. That is, the possible size combinations for the first bank (e.g., the read bank) and the second bank (e.g., the program/erase bank) are limited to 1X/3X (e.g., one array for reading and two arrays for programming/erasing), 2X/2X (e.g., two arrays for reading and one array for programming/erasing), and 3X/1X (e.g., two arrays for reading and one array for programming/erasing).

There is therefore a need for a new and improved integrated circuit for concurrent flash memory having an uneven array architecture which provides improved flexibility and additional bank size combinations.

SUMMARY OF THE INVENTION

A first non-limiting advantage of the invention is that it provides an integrated circuit for concurrent flash memory having improved flexibility.

A second non-limiting advantage of the invention is that it provides an integrated circuit for concurrent flash memory having an uneven array architecture which provides for many different bank size combinations for concurrent read and program/erase operation.

According to a first aspect of the present invention, an integrated memory circuit is provided. The integrated memory circuit includes a first array having a first amount of non-volatile memory cells; a second array having a second amount of non-volatile memory cells; a third array having a third amount of non-volatile memory cells; and a fourth array having a fourth amount of non-volatile memory cells; wherein the third amount is different from the first amount. The first, second, third and fourth arrays are cooperatively linked in a manner which allows a first bank of memory cells including at least one of the first, second, third and fourth arrays to be read, while a second bank of memory cells including the remaining of the first, second, third and fourth arrays is simultaneously programmed or erased.

According to a second aspect of the present invention, an integrated circuit for concurrent flash memory is provided. The integrated circuit includes a first array of flash memory cells; a second array of flash memory cells; a third array of flash memory cells; and a fourth array of flash memory cells; wherein the first and second arrays are of a first size and the third and fourth arrays are of a second size different from the first size. The first, second, third and fourth arrays are coupled together in a manner which allows a first bank of arrays to be selected for a first operation, while a second bank of arrays is simultaneously selected for a second operation.

According to a third aspect of the present invention, a method of performing simultaneous operations within a concurrent flash memory circuit is provided. The method includes the steps of: providing first and second memory cell arrays, each having a first size; providing third and fourth memory cell arrays, each having a second size different from the first size; selecting a first bank of arrays including at least one of the first, second, third and fourth memory cell arrays; selecting a second bank of arrays the including the remaining of the first, second, third and fourth memory cell arrays; and performing a first operation on the first bank of arrays, while simultaneously performing a second operation on the second bank of arrays.

These and other features, advantages, and objects of the invention will become apparent by reference to the following specification and by reference to the following drawings.

BRIEF DESCRIPTION OF THE DRAWINGS

FIG. 2 is a schematic diagram illustrating an integrated circuit for concurrent flash memory in accordance with a preferred embodiment of the invention.

FIG. 3 is a schematic diagram illustrating an integrated circuit for concurrent flash memory in accordance with a second embodiment of the present invention.

DETAILED DESCRIPTION OF THE PREFERRED EMBODIMENT OF THE INVENTION

Figure 1:
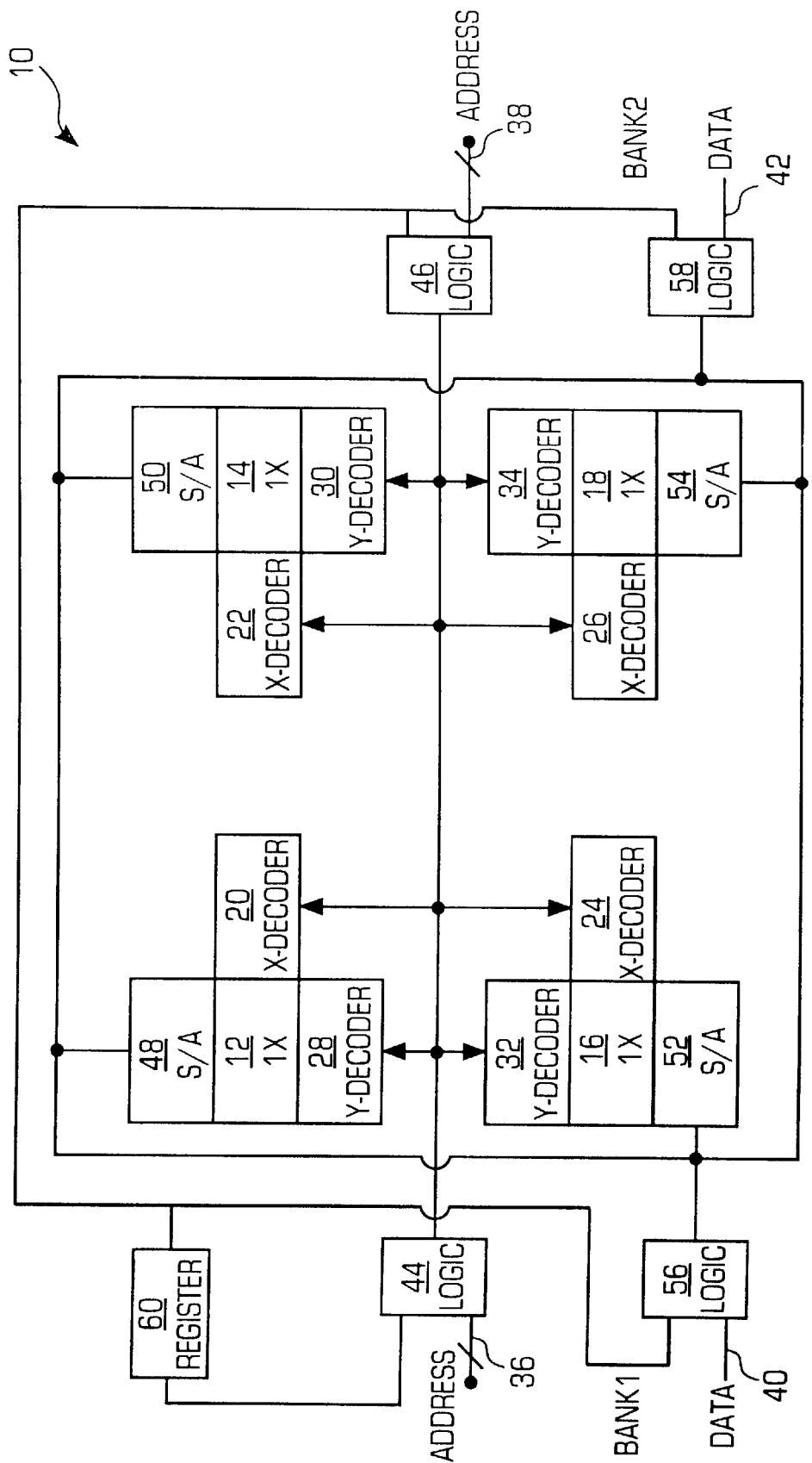
FIG. 1 is a schematic diagram illustrating a prior art concurrent flash memory circuit.

Referring now to FIG. 2, there is shown an integrated circuit 110 for concurrent flash memory which is made in accordance with a preferred embodiment of the present invention and which is adapted for use within a conventional semiconductor integrated circuit device. It should be appreciated by one of ordinary skill in the art that a semiconductor integrated circuit device may employ a plurality of substantially identical circuits 110 in a cooperative manner to perform various conventional memory functions.

In the preferred embodiment, circuit 110 includes four memory cell arrays 112, 114, 116, and 118. Each array includes a plurality of non-volatile memory cells (not shown) which are connected together in a two-dimensional configuration of rows and columns. In the preferred embodiment, the memory cells are flash type memory cells, which may be stacked-gate, split-gate or any other type of flash memory cells. Circuit 110 further includes four X-decoder blocks 120, 122, 124, and 126 which are respectively and communicatively coupled to arrays 112, 114, 116 and 118, and four Y-decoder blocks 128, 130, 132, and 134 which are respectively and communicatively coupled to arrays 112, 114, 116 and 118. Each X-decoder block 120–126 is coupled to address bus 136 and includes a plurality of conventional X-decoders which are effective to select certain rows of the memory arrays 112–118, based upon signals received from address bus 136. Each Y-decoder block 128–134 is coupled to address bus 136 and includes a plurality of conventional Y-decoders which are effective to select certain columns of the memory arrays 112–118, based upon signals received from address bus 136.

Arrays 112, 114, 116 and 118 are cooperatively linked in a known manner which allows memory cells in certain selected arrays to be read, while memory cells in the remaining arrays are concurrently programmed or erased. It should be appreciated that the circuit 110 illustrated in FIG. 2 has been simplified for illustrative purposes and that a memory device employing the present invention may further include additional and/or different circuit components which assist in concurrent reading, programming and erasing of data stored within in arrays 112–118 such as additional buses, sense amplifiers, multiplexers, buffers, counters, shift registers, logic and control circuits and other circuit components necessary and/or desirable to concurrently read, program and erase data. It should further be appreciated that while in the preferred embodiment, four memory arrays are illustrated, in alternate embodiments, different numbers of arrays may be utilized without departing from the spirit and scope of the invention.

Importantly, arrays 112, 114, 116 and 118 contain different amounts of memory cells. In the preferred embodiment of the invention, the array architecture is uneven, but symmetrical about a first (e.g., longitudinal) axis 138. That is, arrays 112, 114 are each substantially the same size (i.e., 1X), and arrays 116, 118 are each three times the size of array 112 or 114 (i.e., 3X). In one non-limiting embodiment, circuit 110 may comprise a sixty-four megabit ("64M") memory circuit, with arrays 112, 114 each having a size of approximately 8M and arrays 116, 118 each having a size of approximately 24M.

This uneven array architecture provides additional bank size combinations for performing concurrent operations, such as reading and programming/erasing. Particularly, unlike prior concurrent flash memory devices in which each array is of the same size (e.g., 1X), the present invention provides improved flexibility by allowing different bank size combinations for reading and programming/erasing. For example and without limitation, the non-limiting embodiment shown in FIG. 1 can employ the following combinations for reading and programming/erasing banks: 1X/7X (e.g., array 112 may be selected for reading, while arrays 114, 116 and 118 are cooperatively linked for programming/erasing, or array 114 may be selected for reading, while arrays 112, 116 and 118 are cooperatively linked for programming/erasing); 2X/6X (e.g., arrays 112 and 114 may be cooperatively linked for reading while arrays 116 and 118 are cooperatively linked for programming/erasing); 3X/5X (e.g., array 116 may be selected for reading, while arrays 112, 114 and 118 are cooperatively linked for programming/erasing, or array 118 may be selected for reading, while arrays 112, 114, and 116 are cooperatively linked for programming/erasing); 4X/4X (e.g., arrays 112, 116 may be cooperatively linked for reading while arrays 114, 118 are cooperatively linked for programming/erasing, or arrays 114, 118 may be cooperatively linked for reading, while arrays 112, 116 are cooperatively linked for programming/erasing); 5X/3X (e.g., array 116 may be selected for programming/erasing, while arrays 112, 114 and 118 are cooperatively linked for reading, or array 118 may be selected for programming/erasing, while arrays 112, 114, and 116 are cooperatively linked for reading); 6X/2X (e.g., arrays 112 and 114 may be selected for programming/erasing while arrays 116 and 118 are cooperatively linked for reading); 7X/1X (e.g., array 112 may be selected for programming/erasing, while arrays 114, 116 and 118 are cooperatively linked for reading, or array 114 may be selected for programming/erasing, while arrays 112, 116 and 118 are cooperatively linked for reading). The cooperative linking of the various arrays for an operation such as reading or programming/erasing is well-known in the art, and is shown by the register 60 and logic circuits 44, 46, 56, 58 of FIG. 1.

In operation, any of the memory cells in the bank of arrays selected for reading may be read while the memory cells in the remaining arrays (i.e., in the bank of arrays selected for programming/erasing) are simultaneously programmed or erased. Likewise, any of the memory cells in the bank of arrays selected for programming/erasing may be programmed or erased, while the memory cells in the remaining arrays (i.e., in the bank of arrays selected for reading) are simultaneously read. It should be appreciated that while the uneven architecture of the preferred embodiment provides for a significantly improved flexibility in available bank size combinations, the symmetry of the circuit about axis 138 also provides for relatively uncomplicated fabrication and routing of buses within the device. It should further be appreciated that the bank size combinations provided by the present invention can be changed dynamically (e.g., by use of registers) or statically (e.g., set at the factory by use of metal strapping). In either event, the present invention allows the inventory for memory chips with different bank sizes to be significantly reduced, thereby desirably reducing production costs.

Referring now to FIG. 3, there is shown a concurrent flash circuit 150 which is made in accordance with the teachings of a second embodiment of the present invention. As shown in FIG. 3, circuit 150 is substantially identical to circuit 110 with the exception that an additional array 140 of size 8X, an X-decoder block 142, and a Y-decoder block 144 have been added. In one non-limiting embodiment, circuit 150 comprises a one-hundred and twenty-eight megabit circuit ("128M"), with arrays 112, 114 each having a size of approximately 8M, arrays 116, 118 each having a size of approximately 24M, and array 140 having a size of approximately 64M.

X-decoder block 142 and Y-decoder block 144 are communicatively coupled to array 140. X-decoder block 142 is further coupled to address bus 136 and includes a plurality of conventional X-decoders which are effective to select certain rows of the memory array 140, based upon signals received from address bus 136. Y-decoder block 144 is also coupled to address bus 136 and includes a plurality of conventional Y-decoders which are effective to select certain columns of the memory array 140, based upon signals received from address bus 136.

Circuit 150 provides an even greater number of bank size combinations for reading and programming/erasing. For example and without limitation, circuit 150 can employ the following combinations for reading and programming/erasing banks: 1X/15X, 2X/14X, 3X/13X, 4X/12X, 5X/11X, 6X/10X, 7X/9X, 8X/8x, 9X/7X, 10X/6X, 11X/5X, 12X/4X, 13X/3X, 14X/2X, and 15x/1x.

Figure 4:
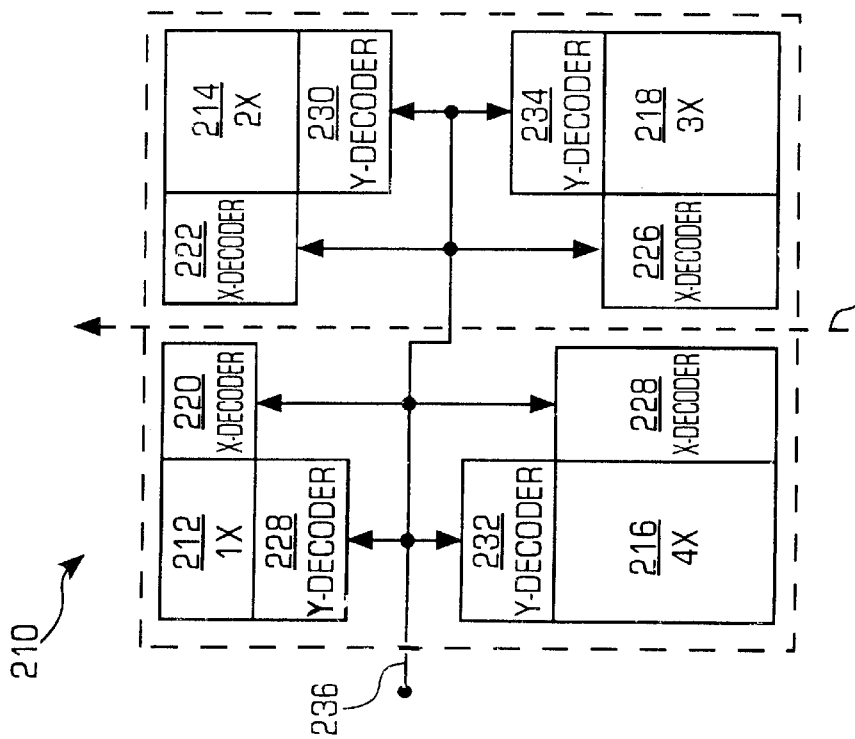
FIG. 4 is a schematic diagram illustrating an integrated circuit for concurrent flash memory in accordance with a third embodiment of the present invention.

Referring now to FIG. 4, there is shown a concurrent flash circuit 210 which is made in accordance with the teachings of a third embodiment of the present invention. As shown in FIG. 4, circuit 210 employs an uneven architecture which is symmetrical in cumulative size about a first (e.g., longitudinal) axis 238, and which may be desirable in certain applications. Particularly, circuit 210 includes four arrays 212, 214, 216 and 218, each having a different size, but the cumulative size of the arrays 212, 216 (e.g., 5X) on one side of axis 238 is equal to the cumulative size of the arrays 214, 216 on the opposing side of axis 238. In the embodiment shown in FIG. 2, array 212 has a size of 1X, array 214 has a size of 2X, array 216 has a size of 4X, and array 218 has a size of 3X.

Each array 212, 214, 216 and 218 includes a respective X-decoder block 220, 222, 224 and 226, and a respective Y-decoder block 228, 230, 232 and 234. X-decoder blocks 220–226 are coupled to address bus 236 and include a plurality of conventional X-decoders which are effective to select certain rows of the memory arrays 212–218, based upon signals received from address bus 236. Y-decoder blocks 228–234 are coupled to address bus 336 and include a plurality of conventional Y-decoders which are effective to select certain columns of the memory arrays 212–218, based upon signals received from address bus 236.

Circuit 210 provides the following available combinations for reading and programming/erasing banks: 1X/9X (e.g., array 212 may be selected for reading, while arrays 214, 216 and 218 are cooperatively linked for programming/erasing), 2X/8X (e.g., array 214 may be selected for reading, while arrays 212, 216 and 218 are cooperatively linked for programming/erasing), 3X/7X (e.g., arrays 212, 214 may be cooperatively linked for reading, while arrays 216, 218 are cooperatively linked for programming/erasing); 4X/6X (e.g., array 216 may be selected for reading, while arrays 212, 214 and 218 are cooperatively linked for programming/erasing); 5X/5X (e.g., arrays 212, 216 may be cooperatively linked for reading, while arrays 214, 218 are cooperatively linked for programming/erasing), 6X/4X (e.g., arrays 212, 214 and 218 may be cooperatively linked for reading, while array 216 is selected for programming/erasing), 7X/3X (e.g., arrays 216, 218 may be cooperatively linked for reading, while arrays 212, 214 are cooperatively linked for programming/erasing), 8X/2X (e.g., arrays 212, 216 and 218 may be cooperatively linked for reading, while array 214 is selected for programming/erasing), and 9X/1X (e.g., arrays 214, 216 and 218 may be cooperatively linked for reading, while array 212 is selected for programming/erasing) It should be appreciated that additional arrays may be added to circuit 210 to provide additional bank size combinations.

Figure 5:
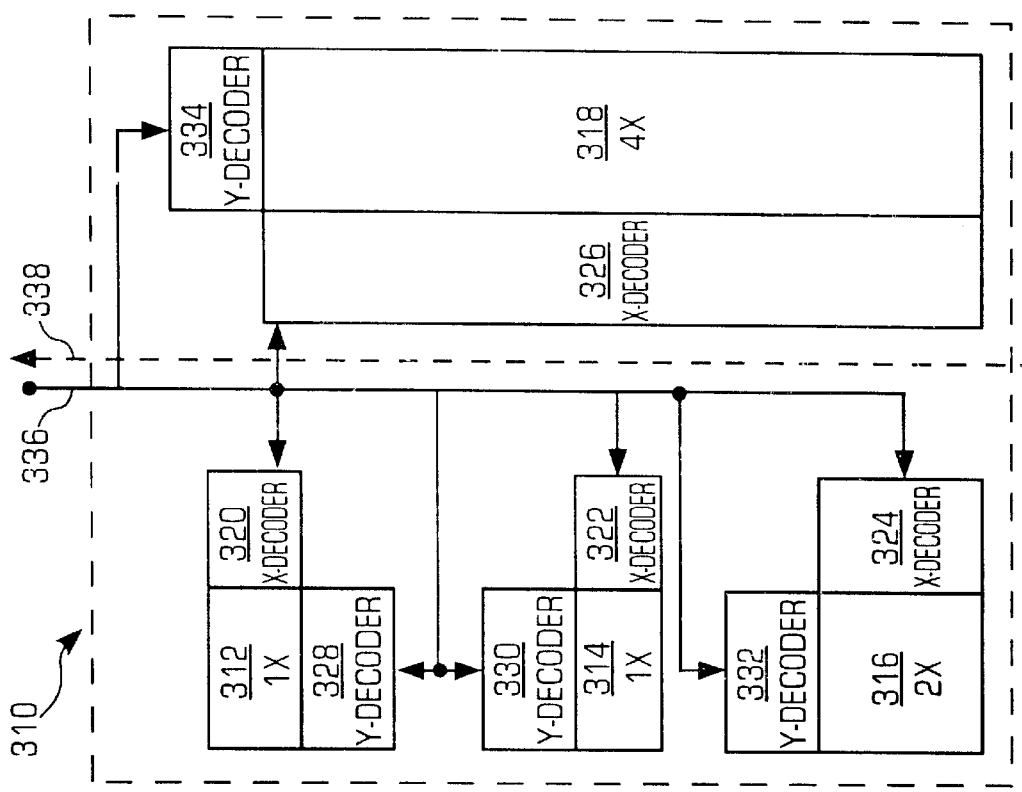
FIG. 5 is a schematic diagram illustrating an integrated circuit for concurrent flash memory in accordance with a fourth embodiment of the present invention.

Referring now to FIG. 5, there is shown a concurrent flash circuit 310 which is made in accordance with the teachings of a fourth embodiment of the present invention. As shown in FIG. 5, circuit 310 employs an uneven architecture in a "binary" configuration which is symmetrical in cumulative size about a first (e.g., longitudinal) axis 338, and which may be desirable in certain applications. Particularly, array 312 has a size of 1X, array 314 has a size of 1X, array 316 has a size of 2X, and array 318 has a size of 4X.

Each array 312, 314, 316 and 318 includes a respective X-decoder block 320, 322, 324 and 326, and a respective Y-decoder block 328, 330, 332 and 334. X-decoder blocks 320–326 are coupled to address bus 336 and include a plurality of conventional X-decoders which are effective to select certain rows of the memory arrays 312–318, based upon signals received from address bus 336. Y-decoder blocks 328–334 are coupled to address bus 336 and include a plurality of conventional Y-decoders which are effective to select certain columns of the memory arrays 312–318, based upon signals received from address bus 336.

Circuit 310 provides the following available combinations for reading and programming/erasing banks: 1X/7X (e.g., array 312 may be selected for reading, while arrays 314, 316 and 318 are cooperatively linked for programming/erasing), 2X/6X (e.g., arrays 312, 314 may be cooperatively linked for reading, while arrays 316, 318 are cooperatively linked for programming/erasing, or array 316 may be selected for reading, while arrays 312, 314 and 318 are cooperatively linked for programming/erasing), 3X/5X (e.g., arrays 314, 316 may be cooperatively linked for reading, while arrays 312, 318 are cooperatively linked for programming/erasing); 4X/4X (e.g., array 318 may be selected for reading, while arrays 312, 314 and 316 are cooperatively linked for programming/erasing, or arrays 312, 314 and 316 may be cooperatively linked for reading, while array 318 is selected for programming/erasing); 5X/3X (e.g., arrays 312, 318 may be cooperatively linked for reading, while arrays 314, 316 are cooperatively linked for programming/erasing), 6X/2X (e.g., arrays 312, 314 and 318 may be cooperatively linked for reading, while array 316 is cooperatively linked for programming/erasing, or arrays 316, 318 may be cooperatively linked for reading, while arrays 312, 314 are cooperatively linked for programming/erasing), and 7X/1X (e.g., arrays 314, 316, 218 may be cooperatively linked for reading, while array 312 is selected for programming/erasing). It should be appreciated that additional arrays may be added to circuit 310 to provide additional bank size combinations.

It should be understood that the inventions described herein are provided by way of example only and that numerous changes, alterations, modifications, and substitutions may be made without departing from the spirit and scope of the inventions as delineated within the following claims.

What is claimed is:

1. An integrated memory circuit comprising:
   a first array having a first amount of non-volatile memory cells;
   a second array having a second amount of non-volatile memory cells;
   a third array having a third amount of non-volatile memory cells; and
   a fourth array having a fourth amount of non-volatile memory cells;
   wherein said third amount is different from said first amount, and said first, second, third and fourth arrays are cooperatively linked in a manner which allows a first bank of memory cells including at least one of said first, second, third and fourth arrays to be read, while a second bank of memory cells including the remaining of said first, second, third and fourth arrays is simultaneously programmed or erased, and wherein each of said first, second, third and fourth arrays is dynamically selectable for read and program or erase operations.

2. The integrated memory circuit of claim 1, wherein said first amount is substantially equal to said second amount.

3. The integrated memory circuit of claim 2, wherein third amount is substantially equal to said fourth amount.

4. The integrated memory circuit of claim 3, wherein third amount is three times as large as said first amount.

5. The integrated memory circuit of claim 1, wherein said first array has a size of 1X, said second array has a size of 2X, said third array has a size of 4X, and said fourth array has a size of 3X.

6. The integrated memory circuit of claim 1, wherein said first array has a size of 1X, said second array has a size of 1X, said third array has a size of 2X, and said fourth array has a size of 4X.

7. The integrated memory circuit of claim 1 wherein said integrated memory circuit has an architecture that is symmetrical about a first axis.

8. The integrated memory circuit of claim 1 further comprising:
   a fifth array having a fifth amount of non-volatile memory cells which is cooperatively linked with said first, second, third and fourth arrays in a manner which allows a third bank of memory cells including at least one of said first, second, third, fourth and fifth arrays to be read, while a fourth bank of memory cells including the remaining of said first, second, third, fourth and fifth arrays is simultaneously programmed or erased.

9. The integrated memory circuit of claim 8, wherein said first and second memory arrays have a size of 1X, said third and fourth memory arrays have a size of 3X, and said fifth memory array has a size of 8X.

10. An integrated circuit for concurrent flash memory comprising:
    a first array of flash memory cells;
    a second array of flash memory cells;
    a third array of flash memory cells; and
    a fourth array of flash memory cells;
    wherein said first and second arrays are of a first size, said third and fourth arrays are of a second size different from said first size, and said first, second, third and fourth arrays are coupled together in a manner which allows a first bank of arrays to be selected for a first operation, while a second bank of arrays is simultaneously selected for a second operation, and wherein said integrated circuit has an architecture that is symmetrical about a first axis.

11. The integrated circuit of claim 10, wherein said second size is approximately three times as large as said first size.

12. The integrated circuit of claim 10, wherein said integrated circuit has an architecture that is asymmetrical about a second axis.

13. The integrated circuit of claim 10, wherein said first, second, third and fourth arrays each includes an X-decoder block and a Y-decoder block.

14. A method of performing simultaneous operations within a concurrent flash memory circuit, comprising the steps of:
    providing first and second memory cell arrays, each having a first size;
    providing third and fourth memory cell arrays, each having a second size different from said first size;
    selecting a first bank of arrays including at least one of said first, second, third and fourth memory cell arrays;
    selecting a second bank of arrays including the remaining of said first, second, third and fourth memory cell arrays; and
    performing a read operation on said first bank of arrays, while simultaneously performing a program/erase operation on said second bank of arrays, wherein each of said first, second, third and fourth arrays is dynamically selectable for read and program/erase operations.

15. The method of claim 14, further comprising the step of arranging said first, second, third and fourth arrays in an architecture which is symmetrical about a first axis.

16. The method of claim 14, wherein said second size is approximately three times as large as said first size.

17. The method of claim 16, wherein said first size is approximately eight megabits and said second size is approximately 24 megabits.

18. The method of claim 14 further comprising the step of:
    providing a fifth memory cell array of a third size; and
    including said fifth memory cell array within a unique one of said first and second bank of arrays.

19. The method of claim 18, wherein said third size is approximately eight times as large as said first size, and said second size is approximately three times as large as said first size.

20. The method of claim 19, wherein said first size is approximately eight megabits, said second size is approximately twenty-four megabits and said third size is approximately sixty-four megabits.

* * * * *